(12) United States Patent
Yu et al.

(10) Patent No.: US 11,855,020 B2
(45) Date of Patent: *Dec. 26, 2023

(54) CHIPLETS 3D SOIC SYSTEM INTEGRATION AND FABRICATION METHODS

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/815,738

(22) Filed: Jul. 28, 2022

(65) Prior Publication Data

US 2022/0384374 A1 Dec. 1, 2022

Related U.S. Application Data

(63) Continuation of application No. 17/077,618, filed on Oct. 22, 2020, now Pat. No. 11,462,495.

(60) Provisional application No. 63/028,117, filed on May 21, 2020.

(51) Int. Cl.
  *H01L 23/00* (2006.01)
  *H01L 23/48* (2006.01)

(52) U.S. Cl.
  CPC ............ *H01L 24/05* (2013.01); *H01L 23/481* (2013.01); *H01L 24/03* (2013.01); *H01L 24/19* (2013.01); *H01L 24/20* (2013.01); *H01L 24/82* (2013.01); *H01L 2224/05009* (2013.01)

(58) Field of Classification Search
  CPC ....... H01L 24/05; H01L 23/481; H01L 24/03; H01L 24/19; H01L 24/20; H01L 24/82; H01L 2224/05009
  See application file for complete search history.

(56) References Cited

U.S. PATENT DOCUMENTS 8,563,403 B1 * 10/2013 Farooq ................ H01L 21/8221
                                                  257/E21.597
10,748,841 B2   8/2020 Chen et al.
10,854,574 B2  12/2020 Chen et al.
(Continued)

FOREIGN PATENT DOCUMENTS

KR   20180114491 A   10/2018
KR   20190055694 A    5/2019
KR   20200047841 A    5/2020

*Primary Examiner* — Mamadou L Diallo
(74) *Attorney, Agent, or Firm* — Slater Matsil, LLP

(57) ABSTRACT

A method includes forming integrated circuits on a front side of a first chip, performing a backside grinding on the first chip to reveal a plurality of through-vias in the first chip, and forming a first bridge structure on a backside of the first chip using a damascene process. The bridge structure has a first bond pad, a second bond pad, and a conductive trace electrically connecting the first bond pad to the second bond pad. The method further includes bonding a second chip and a third chip to the first chip through face-to-back bonding. A third bond pad of the second chip is bonded to the first bond pad of the first chip. A fourth bond pad of the third chip is bonded to the second bond pad of the first chip.

20 Claims, 20 Drawing Sheets

(56) References Cited

U.S. PATENT DOCUMENTS

| | | |
|---|---|---|
| 11,145,626 B2 | 10/2021 | Hwang et al. |
| 2014/0106508 A1* | 4/2014 | Sutardja ................ H01L 25/50 |
| | | 438/109 |
| 2016/0013149 A1* | 1/2016 | Haga .................... H01L 23/291 |
| | | 257/771 |
| 2017/0053902 A1* | 2/2017 | Yu ........................ H01L 23/481 |
| 2019/0148342 A1* | 5/2019 | Hu ........................ H01L 25/105 |
| | | 257/659 |
| 2019/0304913 A1* | 10/2019 | Wu .................... H01L 23/5385 |
| 2019/0304915 A1* | 10/2019 | Jain ....................... H01L 28/20 |
| 2019/0326198 A1 | 10/2019 | Vaidya et al. |
| 2020/0075546 A1* | 3/2020 | Shih ................... H01L 25/0655 |
| 2020/0118908 A1* | 4/2020 | Yu ...................... H01L 23/3677 |
| 2020/0152608 A1 | 5/2020 | Hu et al. |
| 2020/0176384 A1* | 6/2020 | Wu ..................... H01L 21/4857 |
| 2020/0185330 A1* | 6/2020 | Yu ...................... H01L 23/3128 |
| 2020/0188908 A1 | 6/2020 | Cooney et al. |
| 2020/0243448 A1* | 7/2020 | Qian ................... H01L 21/4853 |
| 2020/0365593 A1* | 11/2020 | Chen ................. H01L 23/49513 |
| 2021/0028080 A1* | 1/2021 | Pietambaram ...... H01L 25/0652 |
| 2021/0090983 A1* | 3/2021 | Lin ..................... H01L 23/5385 |
| 2021/0098419 A1* | 4/2021 | Saleh ...................... H01L 24/97 |
| 2021/0134724 A1* | 5/2021 | Rubin ................. H01L 23/5385 |
| 2021/0134760 A1* | 5/2021 | Gaide ................... H01L 21/78 |
| 2021/0159211 A1* | 5/2021 | Rubin ..................... H01L 24/05 |
| 2021/0183722 A1* | 6/2021 | Anderson ............. H01L 21/565 |
| 2021/0225708 A1* | 7/2021 | Lee ........................ H01L 25/18 |
| 2021/0305133 A1* | 9/2021 | Karhade ........... H01L 23/49816 |
| 2021/0398943 A9* | 12/2021 | Chen .................. H01L 21/4814 |

* cited by examiner

CHIPLETS 3D SOIC SYSTEM INTEGRATION AND FABRICATION METHODS

PRIORITY CLAIM AND CROSS-REFERENCE

This application is a continuation of U.S. patent application Ser. No. 17/077,618, filed on Oct. 22, 2020 and entitled "Chiplets 3D SoIC System Integration and Fabrication Methods," now U.S. Pat. No. 11,462,495 B2 issued on Oct. 4, 2022, which claims the benefit of the U.S. Provisional Application No. 63/028,117, filed on May 21, 2020, and entitled "Chiplets 3D SoIC System Integration and Fabrication Methods," which applications are hereby incorporated herein by reference.

BACKGROUND

In the packaging of integrated circuits, multiple chiplets may be bonded to a same larger bottom chip. The chiplets may need to communicate to each other. Conventionally, the communication was made through the through-silicon vias that penetrate through the substrate of the bottom chip, and further through the interconnect structure in the bottom chip. With the increasingly demanding requirement for the integrated circuits, such connection scheme cannot meet the demanding requirements. For example, the wiring paths of the packages adopting this scheme are long, and may not be able to meet the high power-efficiency and low latency requirements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
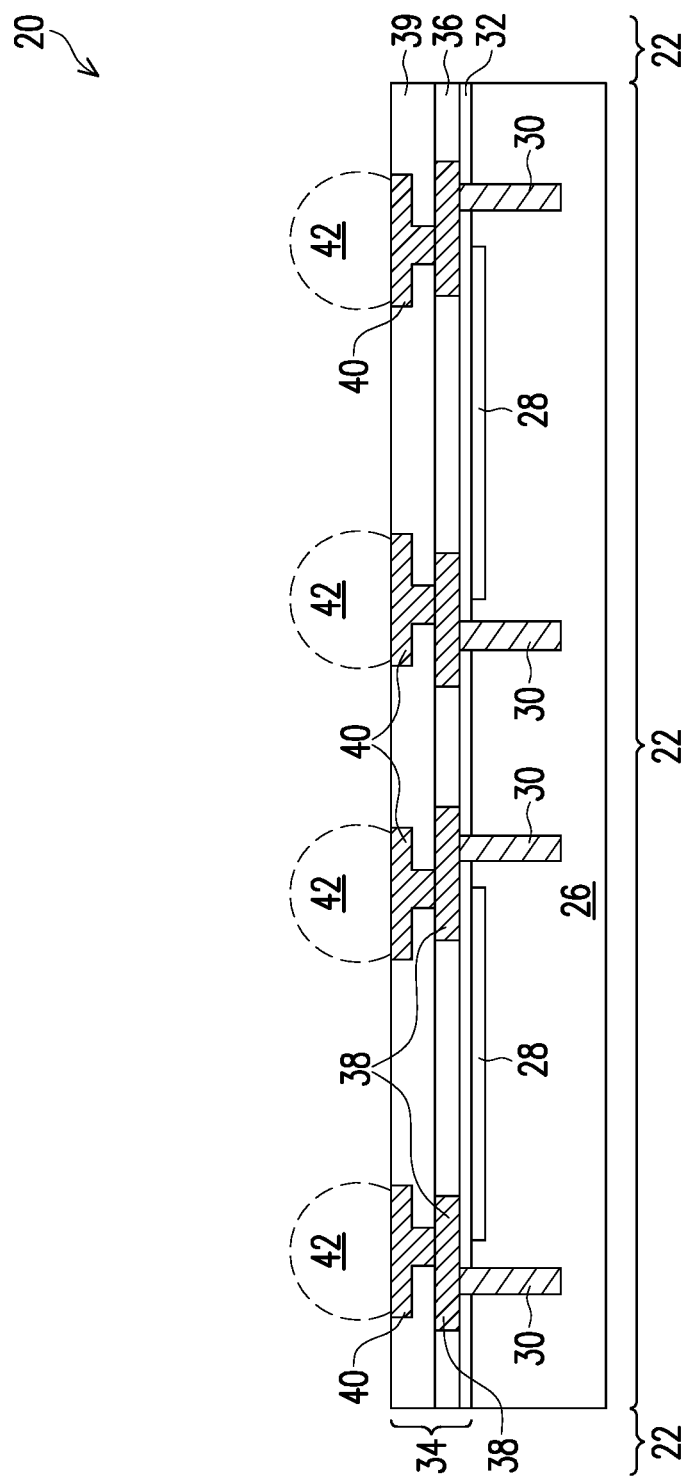
FIGS. 1 through 9 illustrate the cross-sectional views of intermediate stages in the formation of backside bridge structures in a wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including backside bridge structures and the method of forming the same are provided in accordance with some embodiments. In accordance with some embodiments of the present disclosure, the backside bridge structures are formed on the backside of a first-tier chip. A plurality of second-tier chips are bonded to the first-tier chip through a face-to-back bonding scheme, and electrical paths are formed between the second-tier chips. The electrical paths include the pre-formed backside bridge structures in the first-tier chip. With the bridge structures formed on the backside of the bottom chip, the electrical paths are short, and hence the resulting package may meet the power efficiency and latency requirements. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 21:
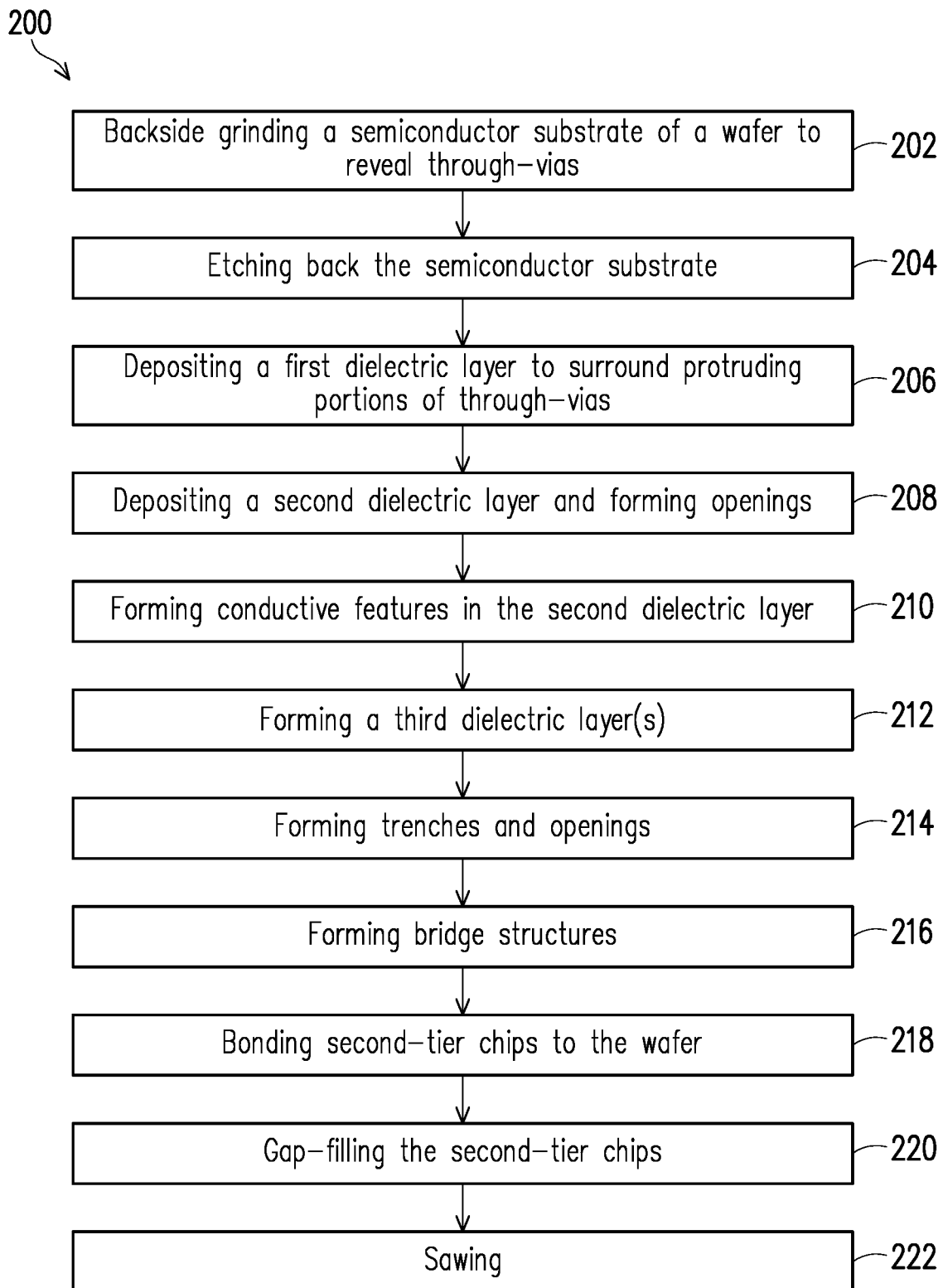
FIG. 21 illustrates a process flow for forming a package including backside bridge structures in accordance with some embodiments.

FIGS. 1-9 and 12 illustrate the cross-sectional views of intermediate stages in the formation of a package in accordance with some embodiments of the present disclosure. The corresponding processes are also reflected schematically in the process flow 200 as shown in FIG. 21.

FIG. 1 illustrates the cross-sectional view of wafer 20. In accordance with other embodiments, wafer 20 is device wafer, which includes integrated circuits 28 therein. Integrated circuits 28 may include active devices such as transistors, and/or passive devices such as capacitors, resistors, inductors, and/or the like. In accordance with some embodiments, wafer 20 is an interposer wafer, which is free from active devices, and may or may not include passive devices.

Wafer 20 includes substrate 26, and through-vias 30 (sometimes referred to as through-silicon vias or through-substrate vias) extending into substrate 26. The active devices such as transistors in integrated circuits 28 may extend into substrate 26. Throughout the description, the side of the semiconductor substrate 26 having the active devices, and/or the side from which through-vias 30 extend into semiconductor substrate 26, is referred to as the front side of substrate 26, and the opposing side is referred to as the backside of substrate 26. Accordingly, the side of wafer 20 on the front side of substrate 26 is referred to as the front side of wafer 20, and the opposing side is referred to as the backside of wafer 20. In the example shown in FIG. 1, the top side is the front side of substrate 26 and wafer 20, and the bottom side is the back side. In accordance with some embodiments of the present disclosure, substrate 26 is a semiconductor substrate, which may be a silicon substrate, a silicon germanium substrate, a carbon-doped silicon substrate, a III-V compound substrate, or the like. When substrate 26 is formed of a semiconductor material, through-vias 30 are encircled by dielectric rings, which electrically insulate through-vias 30 from substrate 26. Through-vias 30 extend to an intermediate level between the top surface and the bottom surface of substrate 26. Through-vias 30 are conductive, and may be formed of copper, aluminum, tungsten, or the like.

In accordance with some embodiments, dielectric layer 32 (which may be an inter-layer dielectric) is formed over substrate 26. Through-vias 30 may extend into dielectric layer 32 in accordance with some embodiments. The top surfaces of through-vias 30 may be level with the top surface of substrate 26, level with the top surface of dielectric layer 32, or may be level with the top surface of any dielectric layer over dielectric layer 32.

Wafer 20 includes chips 22, which are parts of the un-sawed wafer 20. Chips 22 may be device chips, interposer chips, or the like. In accordance with some embodiments, chips 22 are input/output (IO) chips, computing chips (such as Central Processing Unit (CPU) chips, Graphics Processing Unit (GPU) chips, Deep Trench Capacitor (DTC) interposers, Integrated Voltage Regulator (IVR) chips, or the like. Chips 22 may also be any other types of chips that include transistors and passive devices therein.

Over dielectric layer 32 may reside interconnect structure 34, which includes dielectric layers 36 and conductive features 38 formed in dielectric layers 36 (also referred to as Inter-metal Dielectrics (IMDs)). It is appreciated that there may be a plurality of dielectric layers 36 and a plurality of layers of conductive features 38, which are represented by the illustrated dielectric layers 36 and conductive features 38. In accordance with some embodiments, the conductive features 38 include metal lines and vias interconnecting the metal lines in neighboring layers. The metal lines at a same level are collectively referred to as a metal layer hereinafter. In accordance with some embodiments of the present disclosure, interconnect structure 34 includes a plurality of metal layers interconnected through vias. In accordance with some embodiments of the present disclosure, dielectric layers 36 are formed of low-k dielectric materials. The dielectric constants (k values) of the low-k dielectric materials may be lower than about 3.0, for example. Dielectric layers 36 may be formed of or comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 36 includes depositing a porogen-containing dielectric material and then performing a curing process to drive out the porogen, and hence the remaining dielectric layers 36 are porous. Conductive features 38 may be formed of copper or copper alloys, which may be formed of damascene (single damascene and dual damascene processes).

Figure 10:
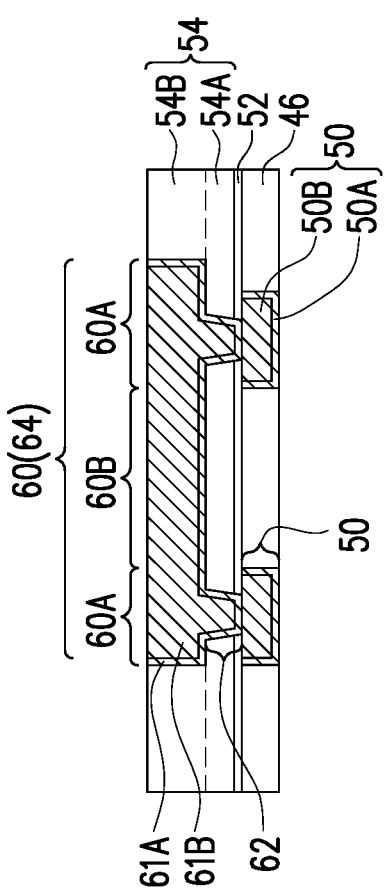
FIG. 10 illustrates an amplified view of a damascene structure in accordance with some embodiments.

Conductive features 38 include damascene structures, which may further include single damascene structures and dual damascene structure. It is noted that conductive features 38 are illustrated schematically, and the illustrated conductive features 38 may represent a plurality of layers of damascene structures. Example single damascene structures may have the similar structure and formed of similar materials as conductive features 50 shown in FIG. 10. Example dual damascene structures may have the similar structure and formed of similar materials as the dual damascene structures 60/62 as shown in FIG. 10. Furthermore, in a dual damascene structure, the conductive line is on the upper side of the respective via(s) in the same dual damascene structure.

Figure 9:
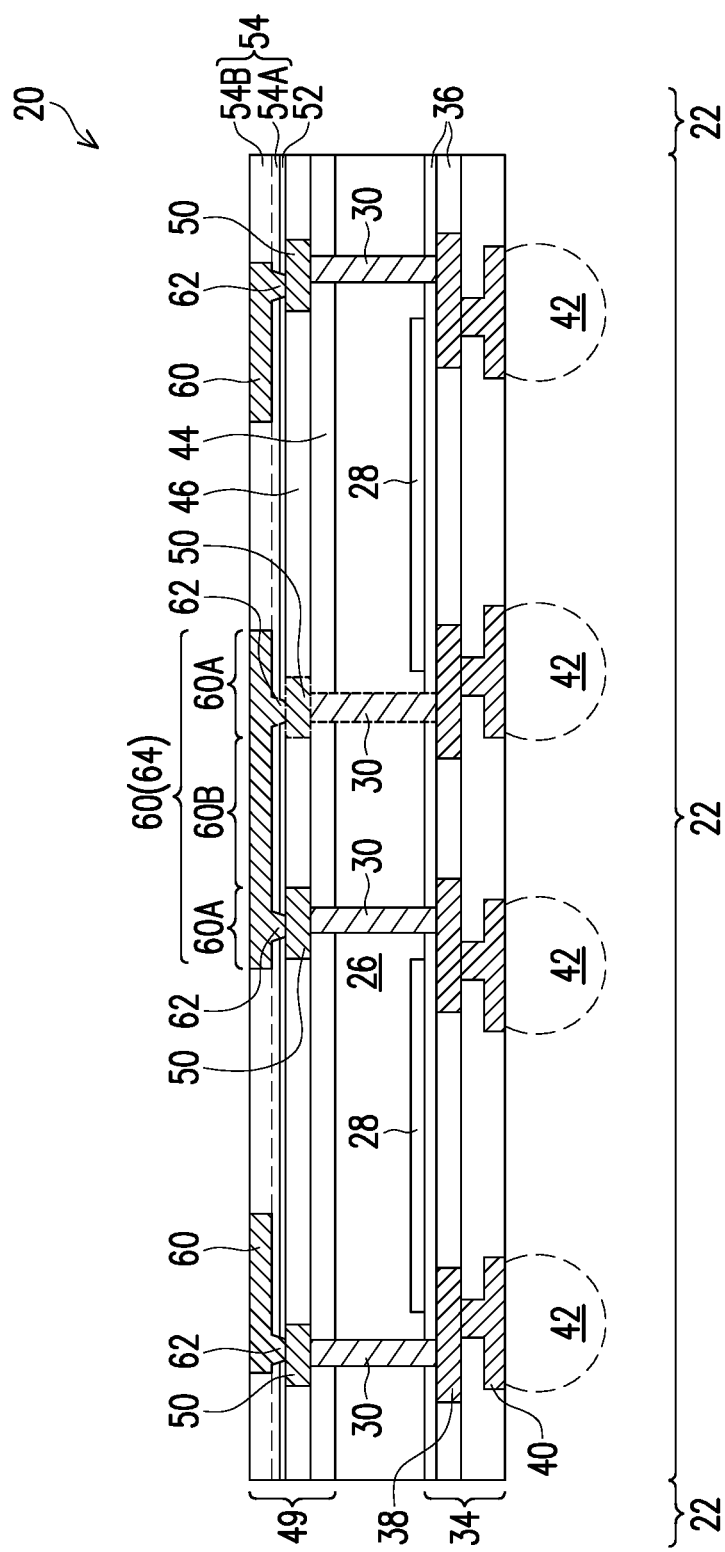
Figure 12:
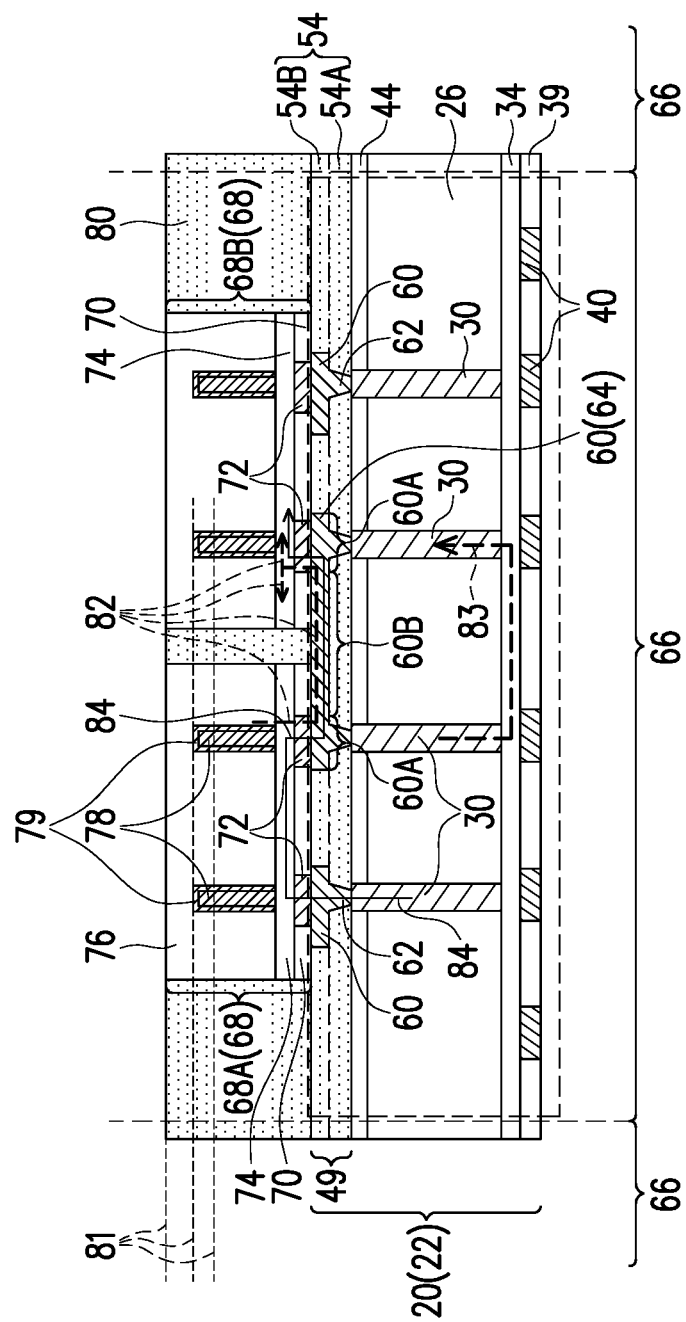
FIGS. 12 through 16 illustrate the cross-sectional views of some packages including backside bridge structures in accordance with some embodiments.

Dielectric layer 39 and Under-Bump Metallurgies (UBMs) 40 are formed over and electrically coupling to conductive features 36. In accordance with some embodiments, solder regions 42 are formed on UBMs 40. In accordance with alternative embodiments, solder regions 42 are formed at a later stage, for example, after the process as shown in FIG. 9, or after the bonding and encapsulation processes as shown in FIG. 12, and possibly before the sawing process as shown in FIG. 12.

Figure 2:
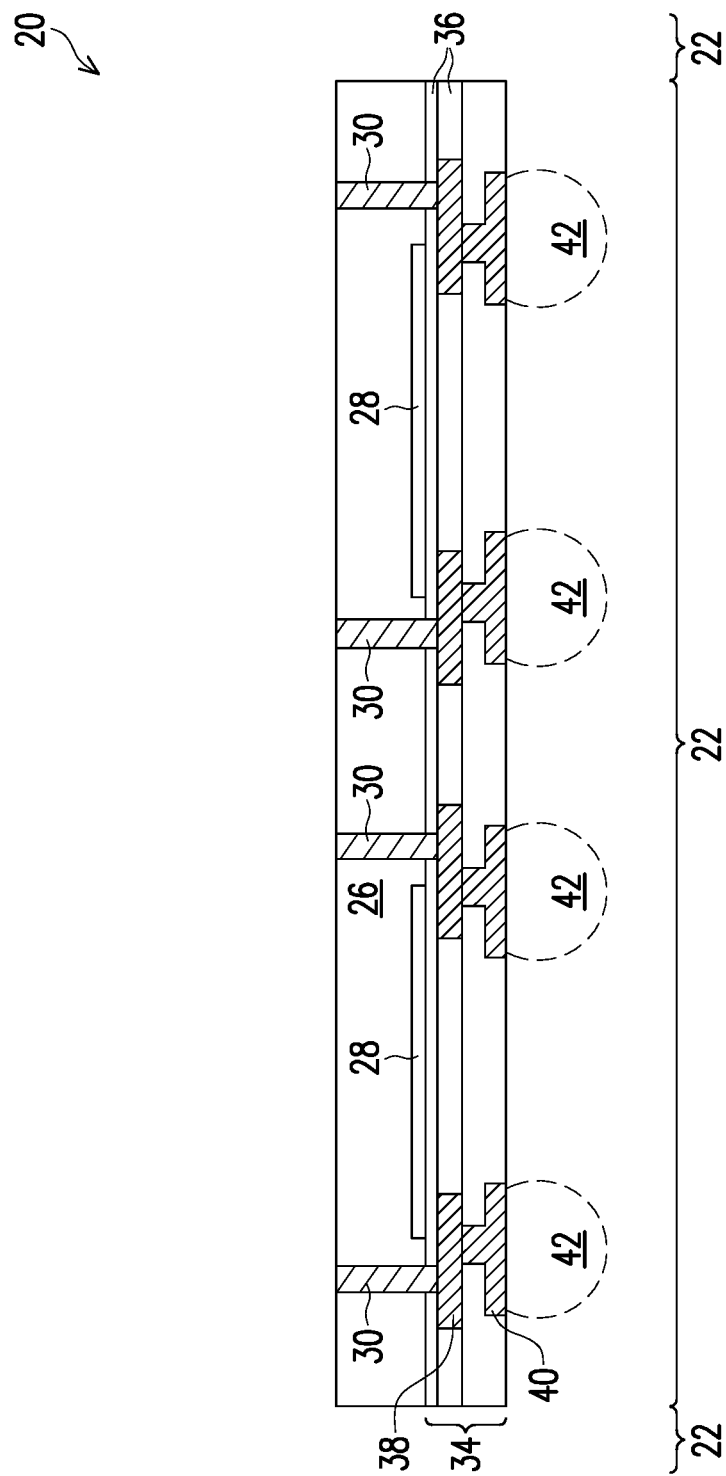
Figure 3:
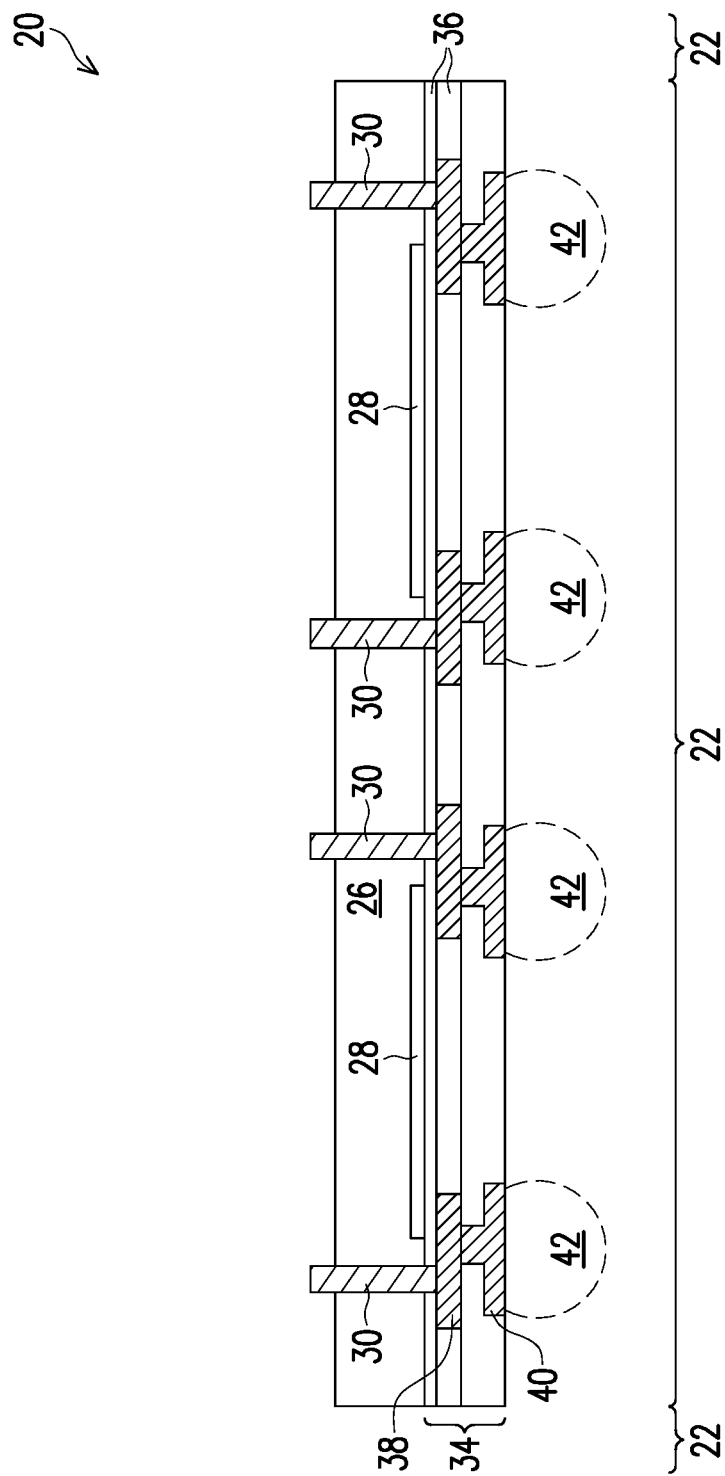
Figure 4:
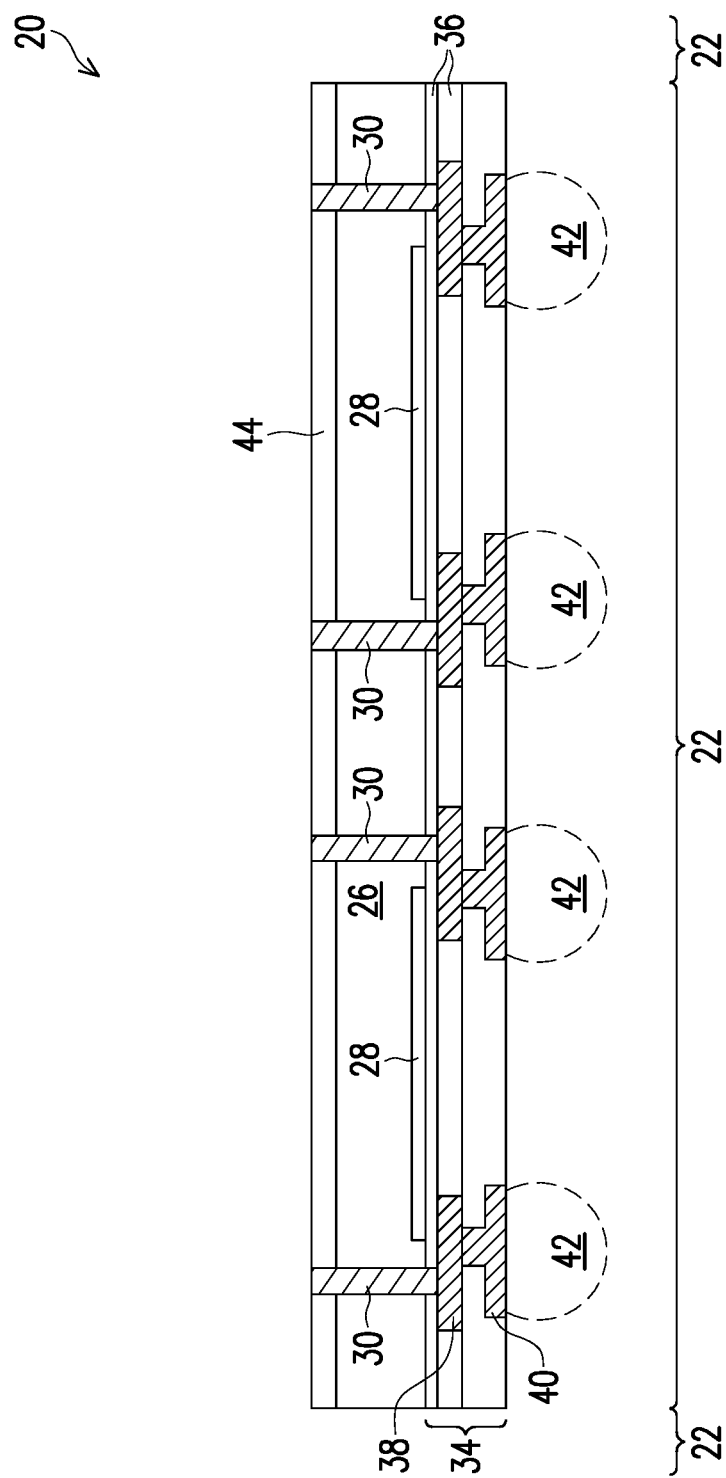

Referring to FIG. 2, a backside grinding process is performed to remove a portion of substrate 26, until through-vias 30 are revealed. The respective process is illustrated as process 202 in the process flow 200 as shown in FIG. 21. Next, as shown in FIG. 3, substrate 26 may be recessed slightly (for example, through etching), so that through-vias 30 protrude out of the back surface of substrate 26. The respective process is illustrated as process 204 in the process flow 200 as shown in FIG. 21. Next, a dielectric layer 44 is deposited, followed by a planarization process such as a Chemical Mechanical Polish (CMP) process or a mechanical grinding process to re-expose through-vias 30, forming the structure shown in FIG. 4. The respective process is illustrated as process 206 in the process flow 200 as shown in FIG. 21. In the resulting structure, through-vias 30 penetrate through both of substrate 26 and dielectric layer 44. In accordance with some embodiments, dielectric layer 44 is formed of or comprises silicon oxide, silicon nitride, or the like.

Figure 5:
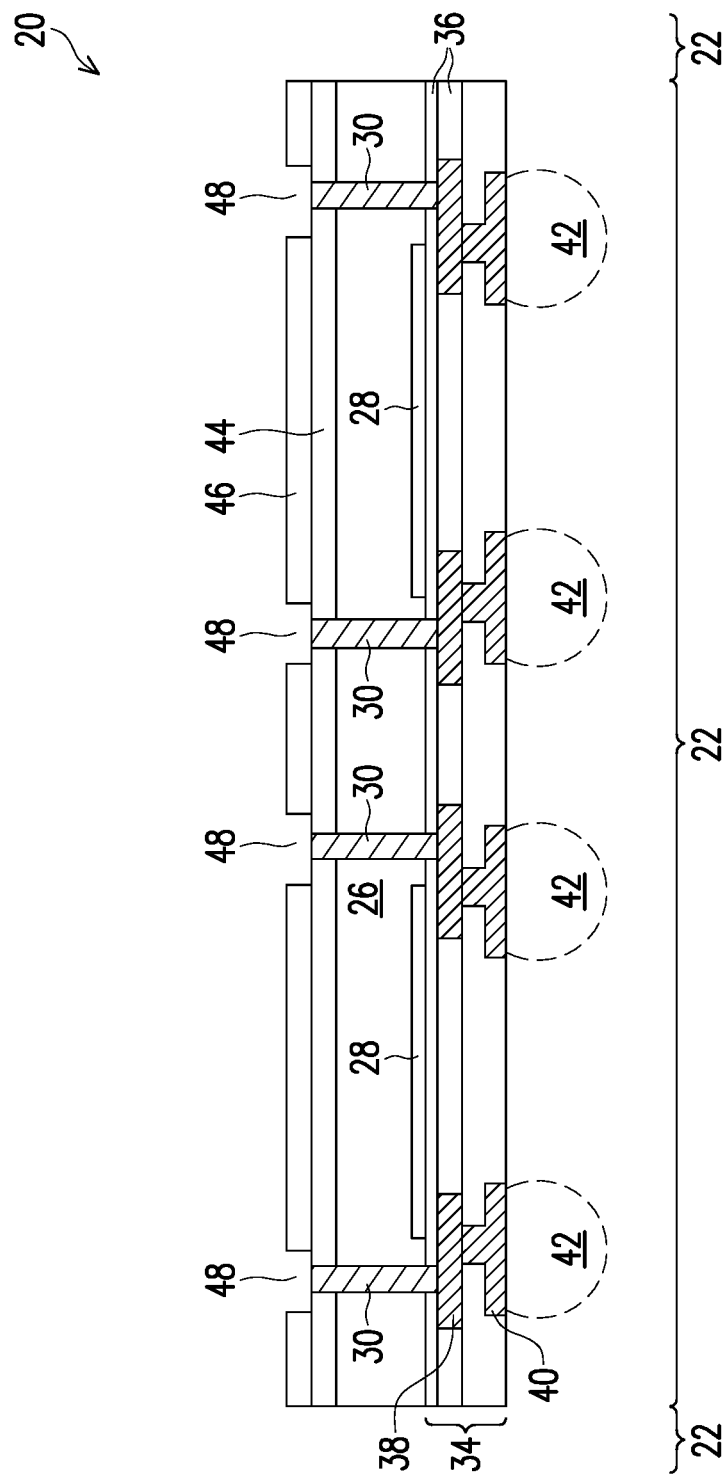
Figure 6:
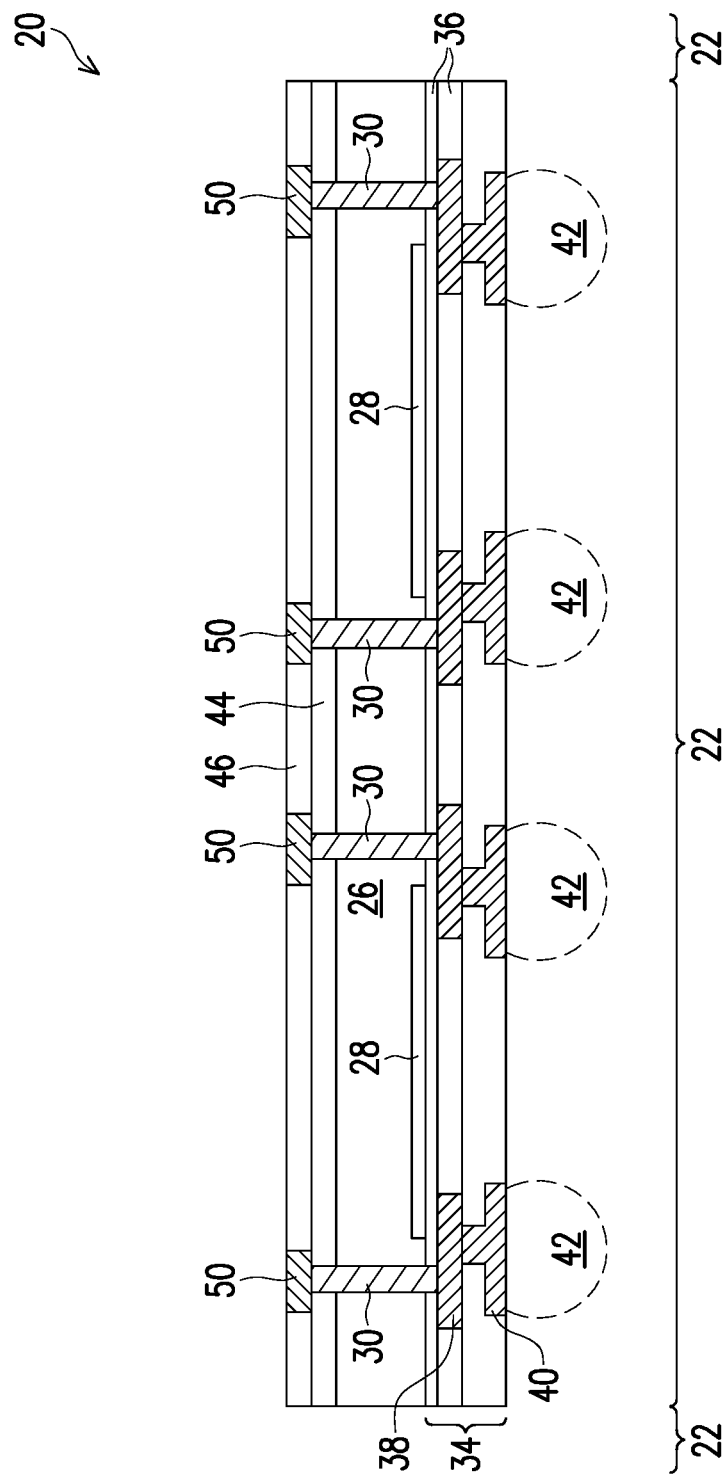

Subsequently, a backside interconnect structure 49 (FIG. 9), which includes one or a plurality of metal layers and bridge structures formed therein, is formed. The backside interconnect structure 49 may include a single damascene structure only, a dual damascene structure only, or the combinations of one or a plurality of single damascene structures and one or a plurality of dual damascene structures. FIGS. 5 and 6 illustrate the formation of dielectric layer 46 and conductive features 50 using a single damascene process in accordance with some embodiments. In accordance with alternative embodiments, the formation of dielectric layer 46 and conductive features 50 is skipped, and the vias in the subsequently formed dual damascene processes are in direct contact with through-vias 30. Referring to FIG. 5, dielectric layer 46 is deposited and then etched. The respective process is illustrated as process 208 in the process flow 200 as shown in FIG. 21. In accordance with some embodiments, dielectric layer 46 is formed of silicon oxide, silicon nitride, silicon oxynitride, silicon oxycarbide, silicate glass, or the like. The material of dielectric layer 46 may be different from the material of dielectric layer 44 so that in the subsequent etching of dielectric layer 46, dielectric layer 44 is not etched-through. A lithography process is performed to etch dielectric layer 46, so that openings 48 are formed. Through-vias 30 are exposed to openings 48.

Referring to FIG. 6, conductive features 50 are formed. The respective process is illustrated as process 210 in the process flow 200 as shown in FIG. 21. Conductive features 50 may include the metal pads for landing the subsequently formed vias, and may or may not include traces for rerouting electrical connections. In accordance with some embodiments, the formation of conductive features 50 includes depositing a conformal diffusion barrier layer (similar to layer 50A in FIG. 10), plating a metallic material (such as copper, similar to material 50B in FIG. 10) over the diffusion barrier layer, and performing a planarization process such as a CMP process or a mechanical grinding process to remove excess materials.

It is appreciated that dielectric layer 46 and conductive features 50 as shown in FIG. 6 may be formed, or the formation of these features may be skipped in accordance with other embodiments. In the embodiments in which the formation processes of dielectric layer 46 and conductive features 50 are skipped, the subsequent vias will be in direct contact with through-vias 30, as is shown in FIG. 12 as a example.

Figure 7:
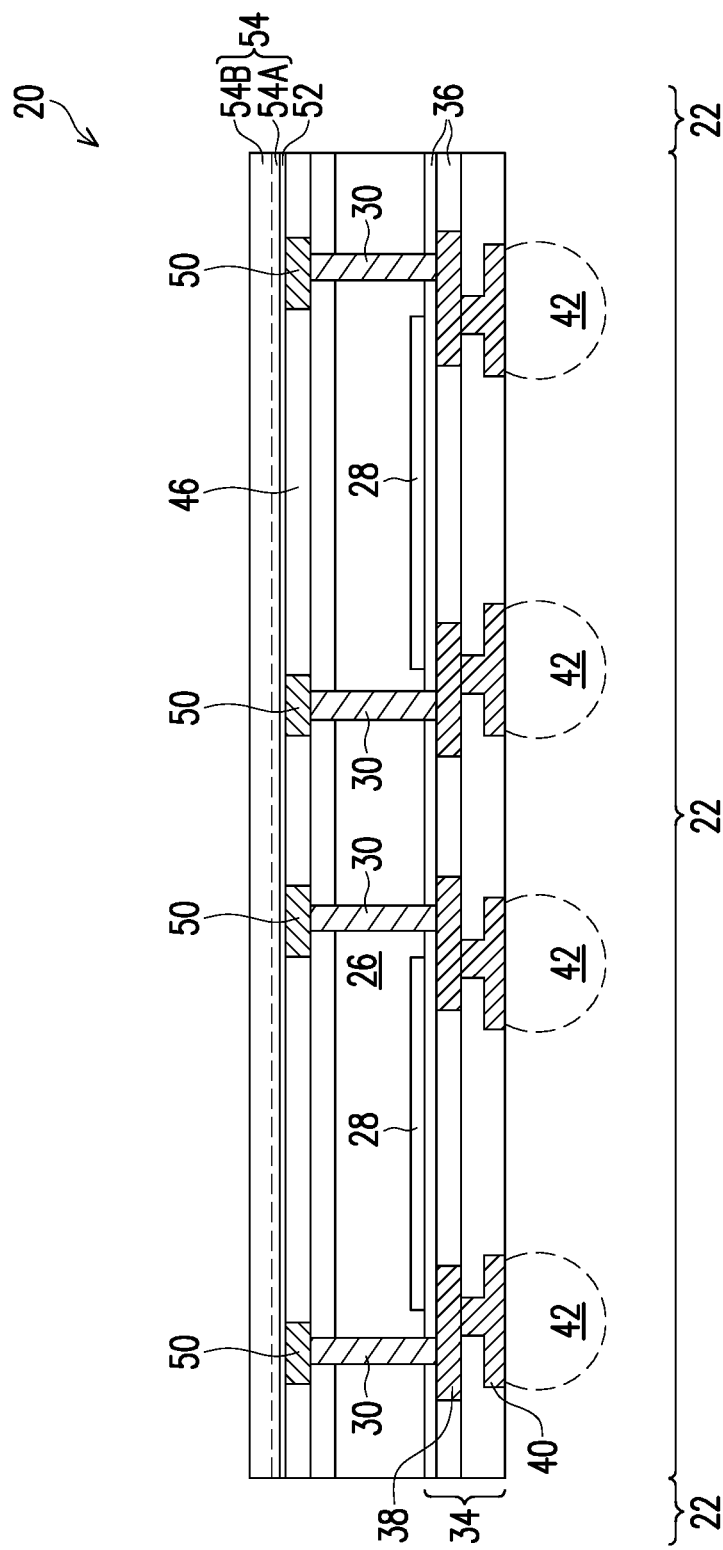
Figure 8:
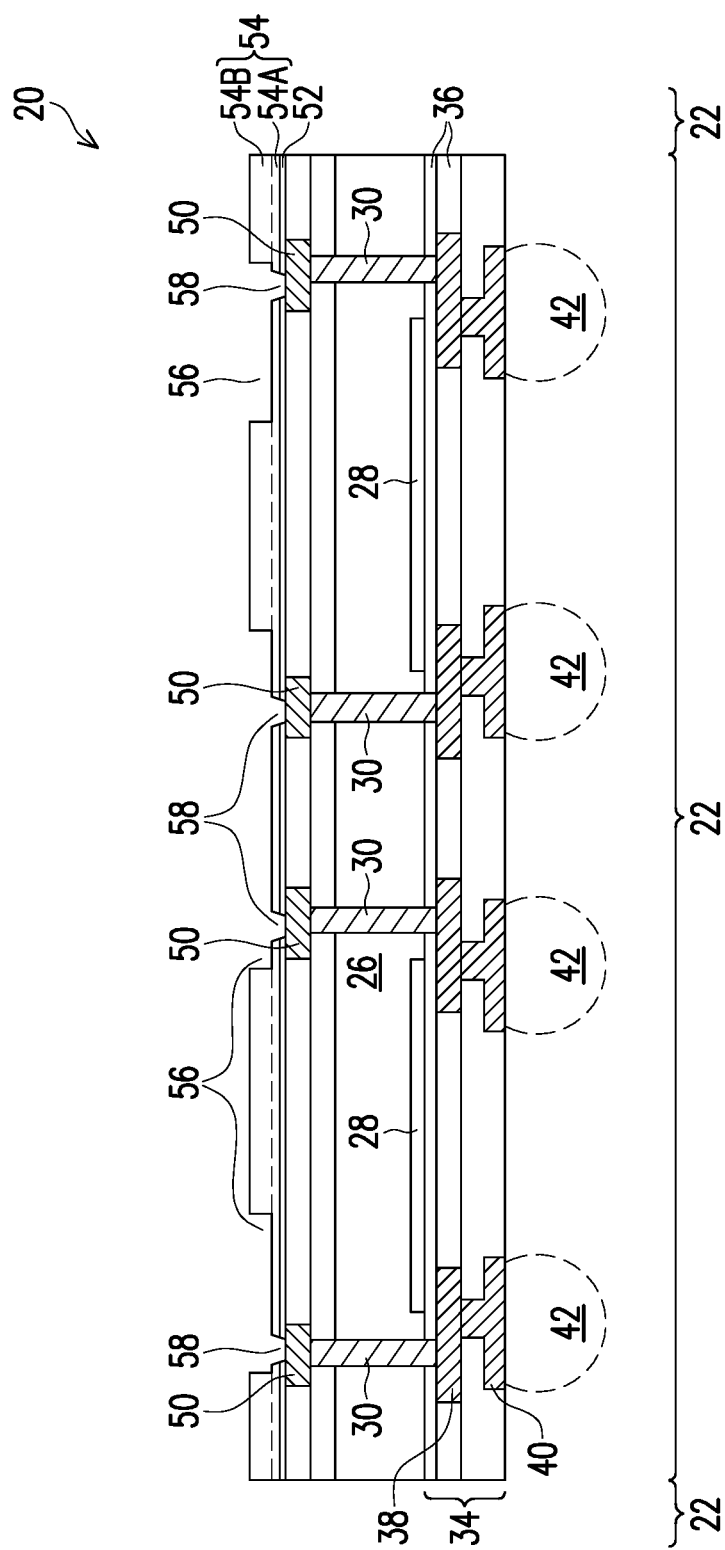

FIGS. 7 through 9 illustrate the formation of bridge structures through a dual damascene process. It is appreciated that although single-layer bridge structures are illustrated as an example, there may be bridge structures including a plurality of layers of single and/or dual damascene structures, depending on the desirable count of bridge structures for interconnecting neighboring chips. Referring to FIG. 7, etch stop layer 52 and dielectric layer 54 are formed through deposition. The respective process is illustrated as process 212 in the process flow 200 as shown in FIG. 21. In accordance with some embodiments, etch stop layer 52 is formed of silicon nitride, silicon carbide, silicon oxynitride, silicon oxy-carbo-nitride, or the like. Next, dielectric layer 54 is deposited. Dielectric layer 54 may be formed of a silicon-containing dielectric material, which may be silicon oxide, silicon nitride, silicon oxynitride or the like. When dielectric layer 54 is not a top dielectric layer in wafer 20, and there are more dielectric layer(s) formed over dielectric layer 54, dielectric layer 54 may be formed of a low-k dielectric material. Otherwise, dielectric layer 54 may be formed of a non-low-k dielectric material as aforementioned. In accordance with some embodiments, dielectric layer 54 includes sub layer 54A, and sub layer 54B over sub layer 54A, wherein sub layers 54A and 54B are formed of different materials, so that sub layer 54A is used for forming via openings, and sub layer 54B is used for forming trenches. Sub layer 54A is further used to stop the etching for forming the trenches. In accordance with alternative embodiments, an entirety of dielectric layer 54 is formed of a homogeneous material.

Referring to FIG. 8, trenches 56 and via openings 58 are formed. The respective process is illustrated as process 214 in the process flow 200 as shown in FIG. 21. In accordance with some embodiments in which dielectric layer 54 includes sub layers 54A and 54B, the formation of trenches 56 is performed using dielectric layer 54A as an etch stop layer to etch dielectric layer 54B. In accordance with alternative embodiments in which dielectric layer 54 is a homogeneous layer, time mode is used to control when to stop the etching for forming trenches 56, so that trenches 56 may stop at an intermediate level between the top surface and the bottom surface of dielectric layer 54. Via openings 58 are formed to penetrate through sub layer 54A (if any) and etch stop layer 52, so that conductive features 50 are revealed.

FIG. 9 illustrates the formation of bridge structures 64, which include metal lines 60 and possibly vias 62 in accordance with some embodiments. Metal line 60 and vias 62 in combination form dual damascene structures. The respective process is illustrated as process 216 in the process flow 200 as shown in FIG. 21. Some details of example dual damascene structures may be found referring to FIG. 10, which illustrates a magnified view of a single damascene structure and a dual damascene structure. In accordance with some embodiments, the formation of metal lines 60 and vias 62 may include depositing a conformal diffusion barrier layer (refer to layer 61A in FIG. 10), plating a metallic material (such as copper, refer to 61B in FIG. 10) over the diffusion barrier layer, and performing a planarization process such as a CMP process or a mechanical grinding process to remove excess materials. The top surfaces of a metal line 60, which also comprises bond pads 60A and metal trace 60B, are coplanar with the top surface of dielectric layer 54.

In accordance with some embodiments, dielectric layer 54 and metal lines 60 are the top features of wafer 20, and the top features are used for bonding to package components such as package components 68 as shown in FIGS. 12 through 16. In accordance with alternative embodiments, additional dielectric layers may be formed, and single or dual damascene structures may be formed over dielectric layer 54 and electrically connecting to metal lines 60. The structures and the formation processes may be similar to what have been shown and discussed referring to FIGS. 5 through 9, and hence are not repeated herein.

Figure 11:
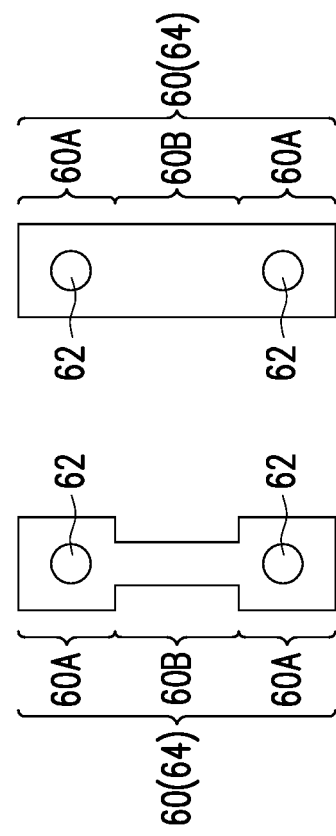
FIG. 11 illustrates top views of some bridge structures in accordance with some embodiments.

Some of metal lines 60 (and possibly vias 62) form bridge structures 64, which are used for the electrical connection between two chips, as shown in FIGS. 12 through 16. Referring to FIG. 11, two example bridge structures 64 are illustrated, with each of the bridge structures including two portions 60A, which are also referred to as bond pads 60A, and portion 60B, which is also referred to as metal trace 60B. Metal trace 60B interconnects bond pads 60A. In FIG. 11, metal trace 60B shown on the left side is narrower than the respective metal pads 60A, and the metal trace 60B shown on the right side has a same width as the respective metal pads 60A.

Referring back to FIG. 9, a bridge structure 64 includes two bond pads 60A, and an electrical path interconnecting bond pads 60A. In the example embodiment as shown in FIG. 9, the electrical path includes metal trace 60B. In accordance with alternative embodiments in which there are two or more metal layers (and the corresponding damascene structures) on the backside of wafer 20, instead of having the metal trace in the same layer as the bond pads 60A, the electrical paths may include two vias 62, and an underlying metal trace (not shown) in an underlying metal layer, with the underlying metal trace electrically intercoupling the two vias 62. In an example embodiment, vias 62 land on the respective underlying metal pads, which are interconnected through a metal trace in between.

In accordance with some embodiments, for example, when the bridge structure includes the metal trace 60B in the top metal layer, the underlying vias 62 may or may not be formed, depending on the requirements of circuits. In accordance with some embodiments, there are two vias 62, two conductive features 50, and two through-vias 30 (as shown in FIG. 9) underlying and electrically connecting to the same bridge structure 64. In accordance with alternative embodiments, there is one via 62, one conductive feature 50, and one through-via 30 (as shown in FIG. 9) electrically connecting to bridge structure 64. For example, one of vias 62, one of conductive features 50, and one of through-vias 30 are illustrated as being dashed to indicate these features may or may not be formed. In yet alternative embodiments, a bridge structure is not connected directly to any underlying via 62, conductive feature 50, and through-vias 30. Whether a bridge structure has any underlying connecting via 62, conductive feature 50 and through via 30 depends on the circuit requirements, and a chip 22 may include any combination of these structures.

FIGS. 12 through 16 illustrate the formation of packages 66 based on wafer 20 in accordance with some embodiments. The wafer 20 and the corresponding chip 22 as shown in FIGS. 12 through 16 are illustrated schematically, and the details of wafer 20 may be found referring to the discussion of FIG. 1 through 9. Furthermore, the solder regions 42 in FIG. 9 are not shown in FIGS. 12 through 16, while the solder regions may or may not be formed in the packages shown in FIGS. 12 through 16. The formation of packages 66 are briefly discussed referring to FIG. 12, and the disclosure can also be applied to the formation of the packages 66 as shown in FIGS. 13 through 16. Throughout the description, chips 22 are referred to as first-tier chips.

Referring to FIG. 12, second-tier chips 68 are bonded to the first-tier chip 22 in wafer 20. The respective process is illustrated as process 218 in the process flow 200 as shown in FIG. 21. Second-tier chips 68 may be chips selected from, and not limited to, computing chips, volatile memories such as Static Random Access Memories (SRAMs), Non-Volatile Memories (NVMs) such as Dynamic Random Access Memories (DRAMs), Artificial Intelligence (AI) accelerators, or the like. Second-tier chips 68 may include digital chips and analog chips. Furthermore, second-tier chips 68 may be stacked chips (cubes) or single chips. For example, SRAM chips, DRAM chips, and NVM chips may be stacked to form memory cubes. The memory cubes may not have controllers therein. In accordance with some embodiments, the controllers, like other second-tier chips 68, may be placed aside of the memory cubes. The controllers are signally connected to, and communicate with, the memory cubes through bridge structures 64. The integrated circuit devices (not shown) are formed in second-tier chips 68, which integrated circuit devices may include transistors formed on the front side (the side facing down) of the corresponding substrate 76.

In accordance with some embodiments, second-tier chips 68 include surface dielectric layer 70, and bond pads 72 in surface dielectric layer 70, with the surfaces of surface dielectric layer 70 and bond pads 72 being coplanar. In accordance with some embodiments, dielectric layer 70 is formed of silicon oxide. Dielectric layer 70 may also be formed of other silicon-containing dielectric material such as silicon nitride, silicon carbide, silicon oxynitride, silicon oxy-carbo-nitride, or the like. Bond pads 72 may be formed of copper or a copper alloy in accordance with some embodiments. Second-tier chips 68 may also include semiconductor substrates 76, and interconnect structures 74 between the semiconductor substrates 76 and the corresponding bond pads 72. Interconnect structures 74 also include dielectric layers, and metal lines and vias, which are not shown in details. Some of the bond pads 72 in neighboring second-tier chips 68 are bonded to opposite ends of bridge structures 64, and are electrically connected to each other through bridge structures 64.

In accordance with some embodiments, through-vias 78 are formed to extend into semiconductor substrate 76. In accordance with other embodiments, through-vias 78 are not formed in the second-tier chips 68. It is appreciated that since second-tier chips 68 are top-tier chips in accordance with these embodiments, through-vias 78 are not used for electrical functions, while they may be formed for, for example, helping heat dissipation. Accordingly, package 66 may be (or may not be) polished, until through-vias 78 are exposed, and a heat sink may be placed over and contacting through-vias 78, so that the heat generated in second-tier chips 68 and first-tier chip 22 may be dissipated to the heat sink effectively. The through-vias 78 in accordance with these embodiments may be electrically floating or electrically grounded in accordance with some embodiments. Through-vias 78 are electrically and physically insulated from semiconductor substrate 76 by insulation layers 79. In subsequent FIGS. 13 through 20, insulation layers 79 are not illustrated, while they still exist.

The bonding of second-tier chips 68 to the first-tier chip 22 may be through face-to-back bonding in accordance with some embodiments, in which the front sides of second-tier chips 68 are bonded to the backside of first-tier chip 22. In accordance with some embodiments, the bonding is performed through hybrid bonding, in which the dielectric layers 70 of second-tier chips 68 are bonded to dielectric layer 44 in first-tier chip 22 through fusion bonding, and bond pads 72 are bonded to metal pads 60A through direct metal-to-metal bonding. The fusion bonding may be achieved through the generation of Si—O—Si bonds, with Si in one of dielectric layers 70 and 44, and O—Si in the other one of dielectric layers 70 and 44. In the top view of the bonded structure, first-tier chip 22 is larger than at least one, and possibly the combination of two or more of the overlying second-tier chips 68. First-tier chip 22 may extend laterally beyond the combined regions including all of the second-tier chips 68 bonded thereon.

In accordance with some embodiments, the dielectric layer 54 including the dual damascene structures 60/62 is a single layer formed of a homogeneous material. In accordance with alternative embodiments, the dielectric layer 54 including the dual damascene structures 60/62 therein is a dual layer including sub layers 54A and 54B (refer to FIG. 9).

After the bonding of second-tier chips 68 to first-tier chip 22, gap-filling material 80 is applied to fill the gaps between, and to encapsulate, second-tier chips 68. The respective process is illustrated as process 220 in the process flow 200 as shown in FIG. 21. Gap-filling material 80 may be formed of or comprises an organic material such as molding compound, a molding underfill, an epoxy, a resin, or the like. Alternatively, gap-filling material 80 may also be formed of an inorganic material(s) such as silicon nitride, silicon oxide, or the like. For example, gap-filling material may include a silicon nitride layer as an adhesion layer (which is also a liner), and a silicon oxide layer on the silicon nitride layer. The applied gap-filling material 80, if formed in a flowable form, is then cured. A planarization process such as a CMP process or a mechanical grinding process is then performed to level the top surface of gap-filling material 80. In accordance with some embodiments, the planarization process is stopped when there is still a portion of gap-filling material 80 covering second-tier chips 68, as shown in FIG. 12. In accordance with alternative embodiments, the planarization process is performed until through-vias 78 are exposed. In accordance with yet other embodiments, the planarization process is performed after isolation layers 79, which insulate through-vias 78 from substrate 26, are exposed, but before the top portions of isolation layers 79 are polished-through. Accordingly, through-vias 78 are covered and surrounded by isolation layers 79.

The bonding of second-tier chips 68 to wafer 20 may be at wafer level, wherein a plurality of groups of second-tier chips 68 are bonded to the corresponding first-tier chips 22. A sawing process may be performed to saw-through gap-filling material 80, so that a plurality of packages 66 are formed. The respective process is illustrated as process 222 in the process flow 200 as shown in FIG. 21.

FIG. 12 illustrates electrical path 82, which includes bridge structure 64. Electrical path 82 is used for the electrical connection and signal communication between neighboring second-tier chips 68. Furthermore, bridge structure 64 may be used for transferring and redistributing power. For example, electrical path 82 shows an example power transferring route, wherein power is provided by a power source (not shown) that is either inside or underlying first-tier chip 22. For example, chip 22 may be an IVR chip in accordance with some embodiments. The power is passed through one of through-vias 30, and is fed to second-tier chip 68A. The power is further transferred in the interconnect structure 74 in second-tier chip 68A, and to bridge structure 64, so that power is provided to the second-tier chip 68B. Through this power supplying scheme, the power and signal paths are short because the signal communication and power transfer between the second-tier chips 68 do not need to go to the front side of first-tier chip 22, as shown by dashed route 83.

Figure 13:
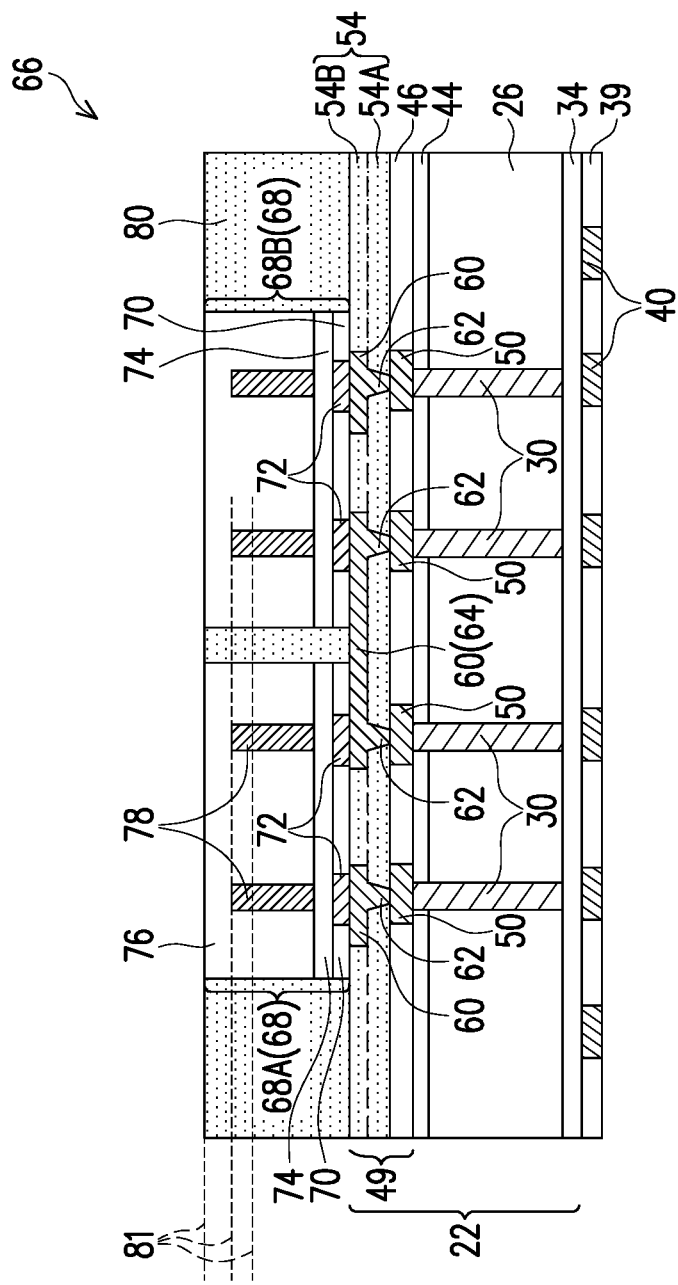

FIG. 13 illustrates package 66 in accordance with alternative embodiments. These embodiments are similar to the embodiments as shown in FIG. 12, except that in FIG. 12, vias 62 of the damascene structure are in physical contact with through-vias 30, while in FIG. 13, conductive features 50 are formed over and contacting through-vias 30, and vias 62 are in contact with conductive features 50, which may be formed using a single damascene process. Also, as shown in FIG. 13, the dashed line drawn between dielectric layers 54A and 54B indicate that dielectric layer 54 may be formed of a homogeneous material, or may include two dielectric layers.

Figure 14:
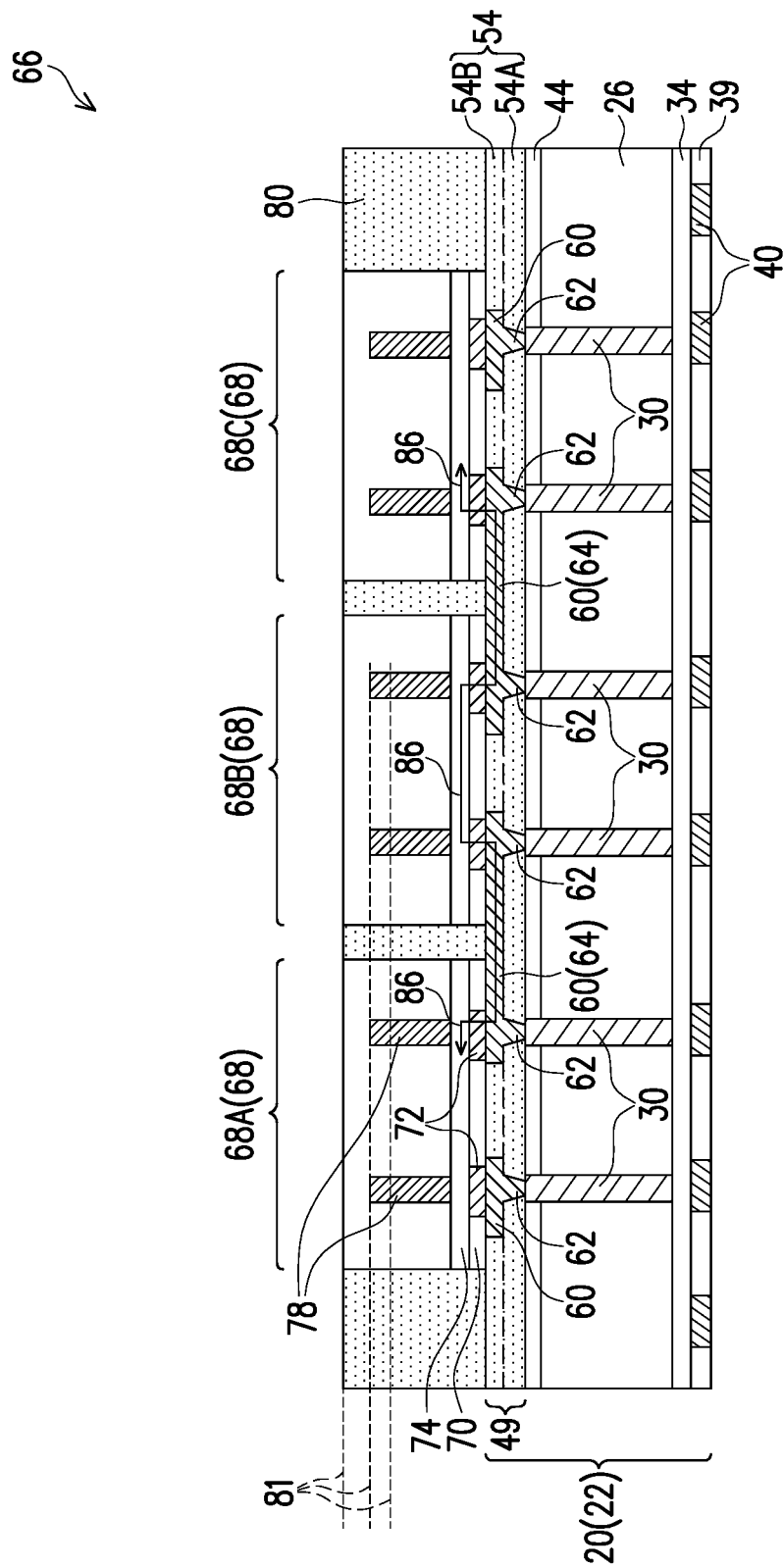

FIG. 14 illustrates package 66 in accordance with alternative embodiments. These embodiments are similar to the embodiments as shown in FIG. 12, except that there are three second-tier chips 68 (including 68A, 68B, and 68C) bonding to the same first-tier chip 22. Each of second-tier chips 68A, 68B, and 68C may be electrically connected to the neighboring second-tier chips through bridge structures 64. In accordance with some embodiments, the power is transferred from the front side of chip 22, through one of through-vias 30, and distributed to all of second-tier chips 68 through bridge structure 64 and the interconnect structures 74 in the second-tier chips 68. An example power redistribution path 86 is illustrated. Signals are also transferred through the bridge structures 64 between second-tier chips 68. Also, as shown in FIG. 14, the dashed line drawn between dielectric layers 54A and 54B indicate that dielectric layer 54 may be formed of a homogeneous material, or may include two dielectric layers.

Figure 15:
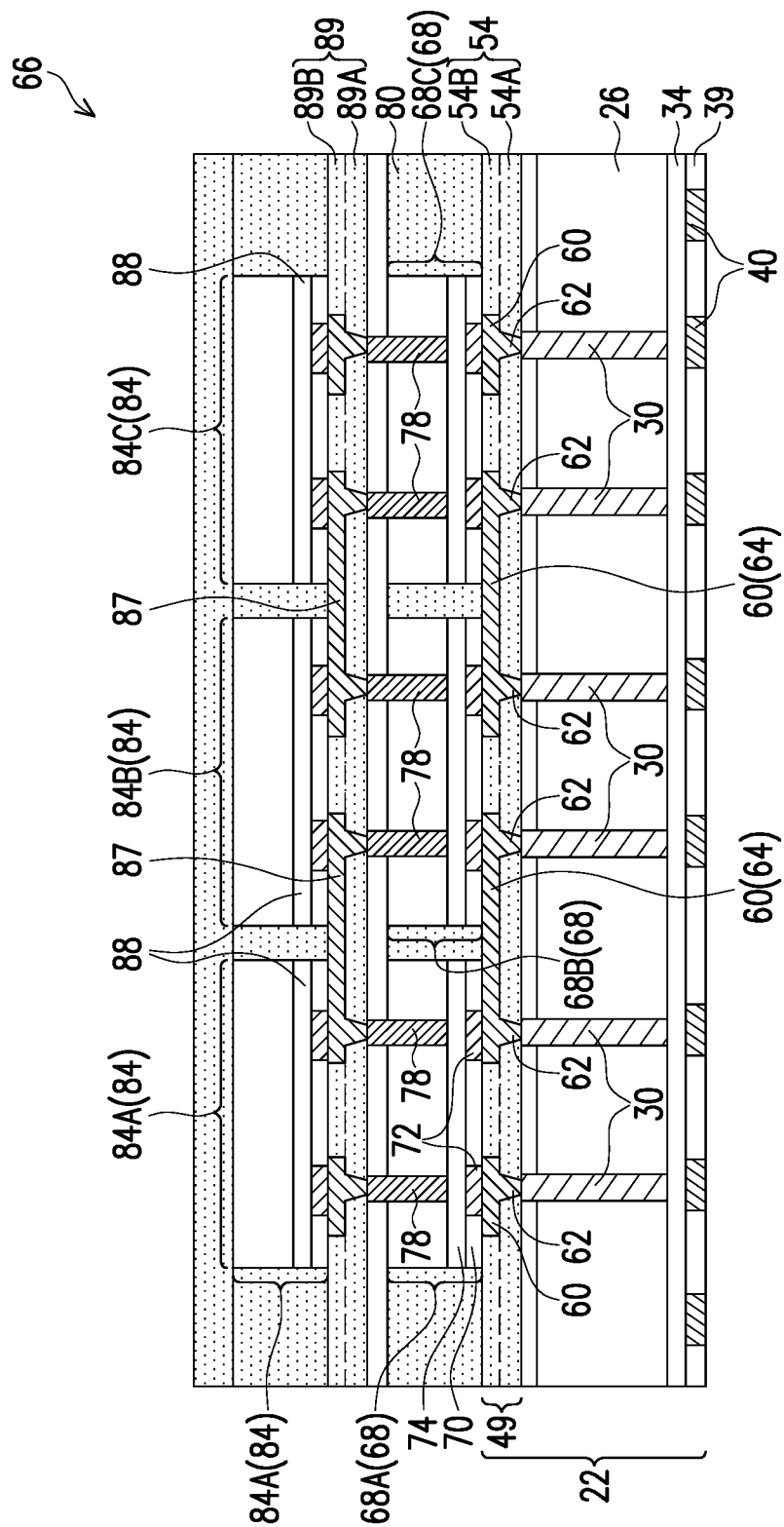

FIG. 15 illustrates package 66 in accordance with alternative embodiments. These embodiments are similar to the embodiments as shown in FIG. 14, except that a plurality of third-tier chips 84 (including 84A, 84B, and 84C) are bonded to the corresponding second-tier chips 68 (including 68A, 68B, and 68C) through face-to-back bonding. Accordingly, bridge structures 87 are formed on the backside of second-tier chips 68. The bridge structures 87 may have the similar structures, and are formed using similar methods and similar materials, as bridge structures 64. Each of third-tier chips 84A, 84B, and 84C may be electrically connected to the neighboring third-tier chips through bridge structures 87. In accordance with some embodiments, power is transferred through one of through-vias 30, and distributed to second-tier chips 68. The power is further transferred through one or more of through-vias 78, and distributed to all of third-tier chips 84 through bridge structures 87 and the interconnect structures 88 in the third-tier chips 84. Signals are also transferred through the bridge structures 87 between third-tier chips 84. Also, as shown in FIG. 15, the dashed lines drawn between dielectric layers 54A and 54B indicate that dielectric layer 54 may be formed of a homogeneous material, or may include two dielectric layers. The dashed lines drawn between dielectric layers 89A and 89B indicate that dielectric layer 89 may be formed of a homogeneous material, or may include two dielectric layers.

Figure 16:
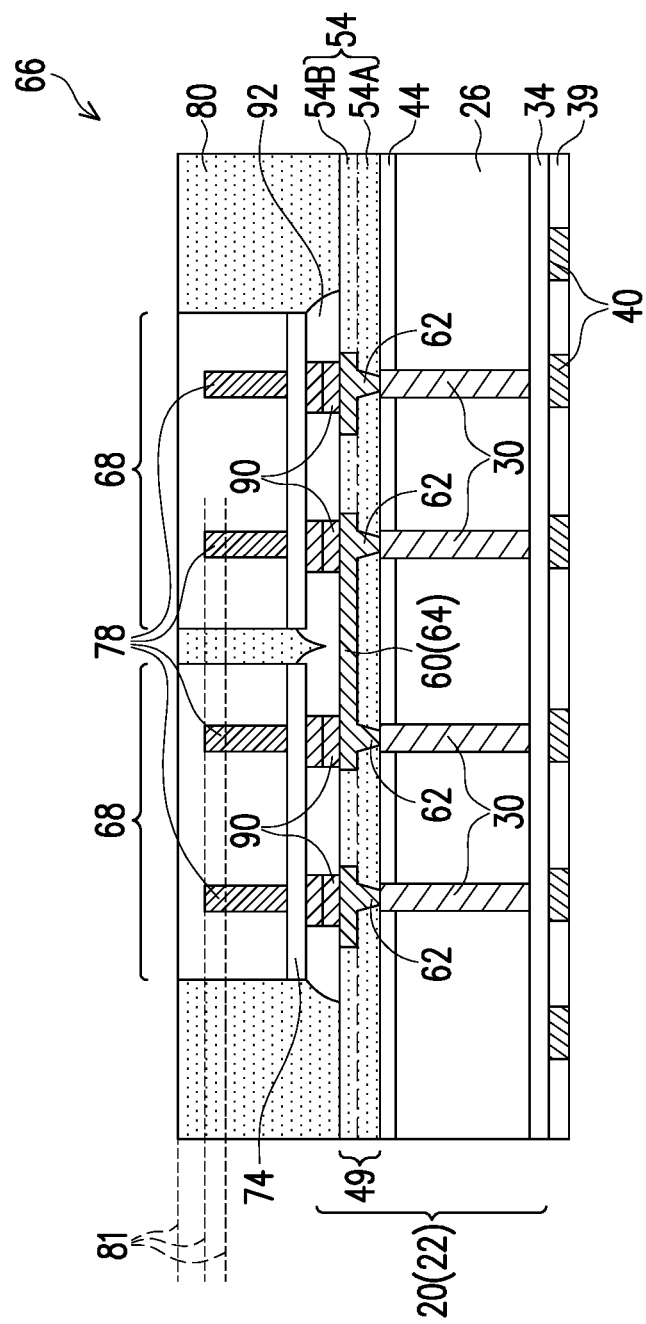

In the embodiments shown in FIGS. 12 through 15, hybrid bonding is used to bond upper-tier chips to the lower-tier chips. In accordance with alternative embodiments, the bonding scheme as shown in FIGS. 12 through 15 may be replaced with other bonding schemes such as micro-bump direct bonding, solder bonding, or the like. For example, FIG. 16 illustrates an embodiment similar to the embodiments shown in FIG. 12, except that micro-bumps 90 are used to bond second-tier chips 68 to the first-tier chip 22. Micro-bumps 90 may be metal pillars, solder regions, or the composite structures including metal pillars and solder regions on the metal pillars. In accordance with some embodiments, underfill 92 is dispensed between the upper-tier chips (such as 68) and the corresponding lower-tier chip(s) (such as 22).

Figure 17:
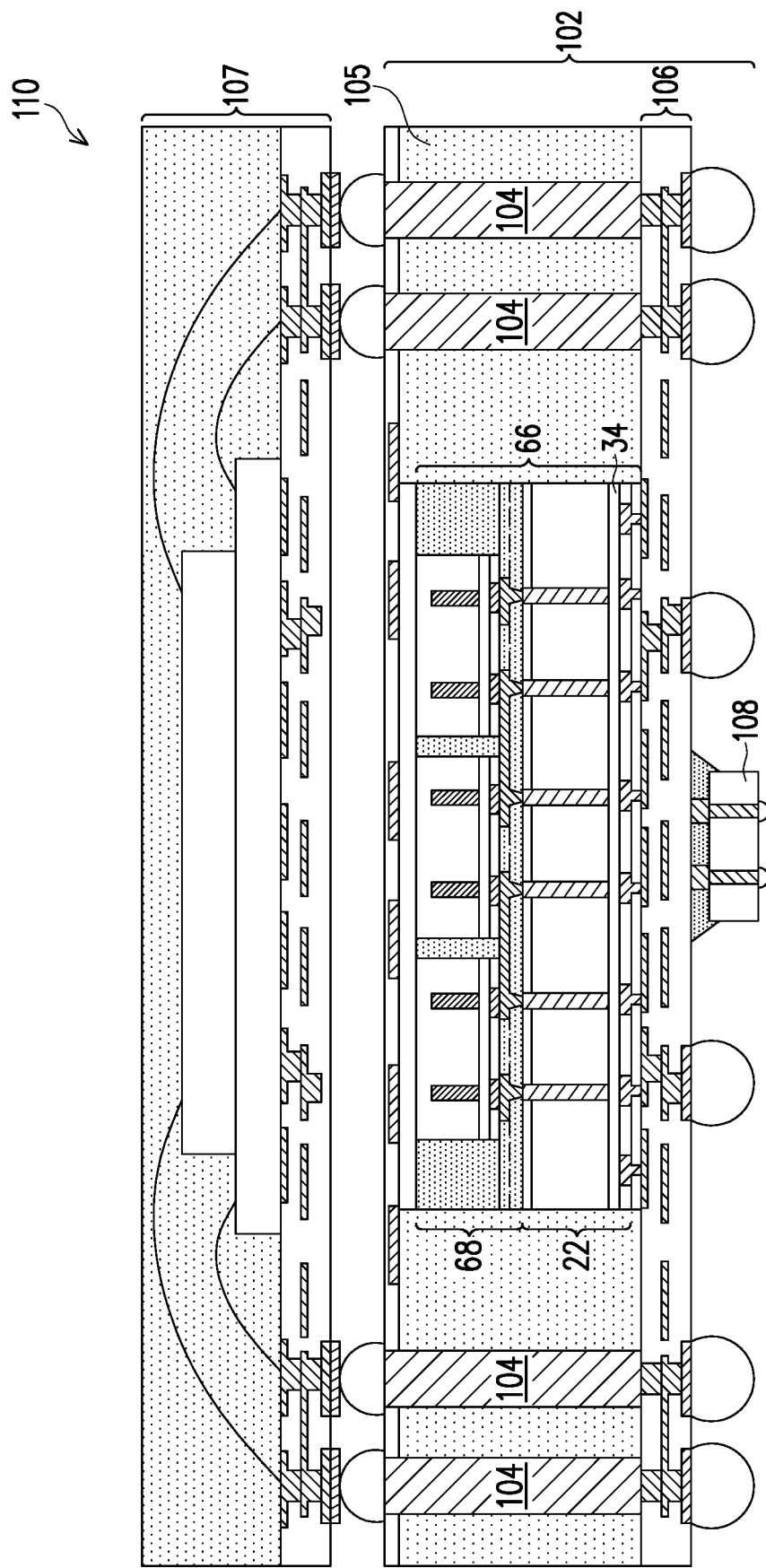
FIGS. 17 through 20 illustrate the cross-sectional views of some packages in accordance with some embodiments.

The packages 66 may be used in various applications, with FIGS. 17 through 20 illustrating some of the example applications. The packages 66 as shown in FIGS. 17 through 20 may be any of the packages as shown in FIGS. 12 through 16, or the combinations and/or modifications, of these embodiments. Referring to FIG. 17, package 110 is formed. Package 66 is used in a fan-Out package 102, which includes package 66, through-molding vias 104, and encapsulant 105 encapsulating package 66 and through-molding vias 104 therein. Interconnect structure 106 is formed as a fan-out structure extending laterally beyond the edges of package 66. In accordance with some embodiments, Integrated Passive Device (IPD) 108, which may be a capacitor die, a resistor die, an inductor die, or the like, is bonded to interconnect structure 106. Package 102 is further bonded to fan-Out package 107. Package 107 may include, for example, memory dies, memory cubes, or the like.

Figure 18:
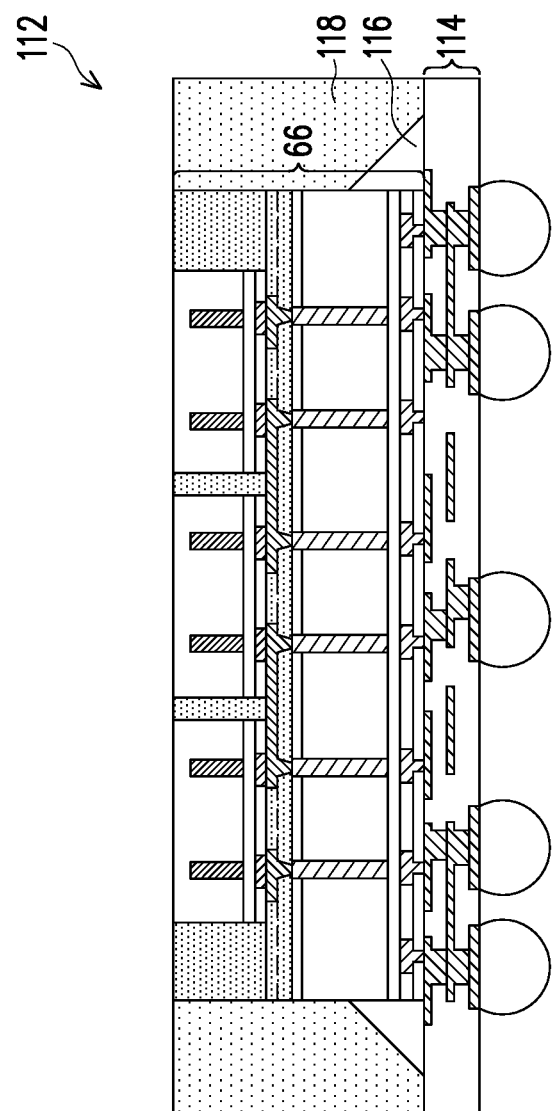

FIG. 18 illustrates flip-chip chip-level package 112, which includes package 66 bonding to package component 114. Package component 114 may be formed of or comprise a package substrate, an interposer, a printed circuit board, or the like. The bonding may include hybrid bonding, solder (flip-chip) bonding, metal-to-metal direct bonding, or the like. Underfill 116 may be dispensed in the gap between package 66 and package component 114. Encapsulant 118 may further be dispensed to encapsulate package 66.

Figure 19:
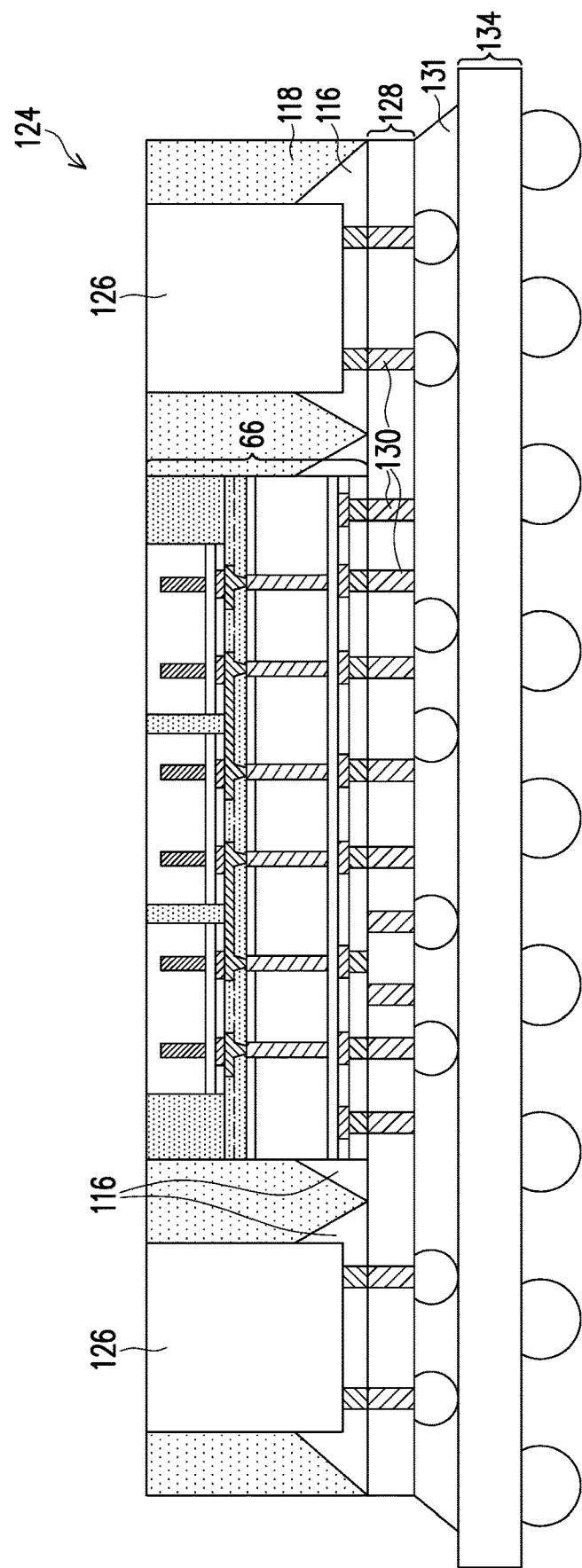

FIG. 19 illustrates (flip-chip) chip-level package 124, which includes package 66 bonding to package component 128. Package component 128 may be an interposer chip, a device chip, or the like. Through-vias 130 are formed in package component 128, and penetrate through the substrate of package component 128. Package component 128 is further bonded to package component 134, which may be a package substrate, a printed circuit board, or the like. In accordance with some embodiments, packages components 126, which may be device chips, packages, memory cubes, or the like, are further bonded to package component 128, and are electrically connected to package 66, for example, through the redistribution lines in package component 128. Underfills 116 and 131 and encapsulant 118 are further dispensed.

Figure 20:
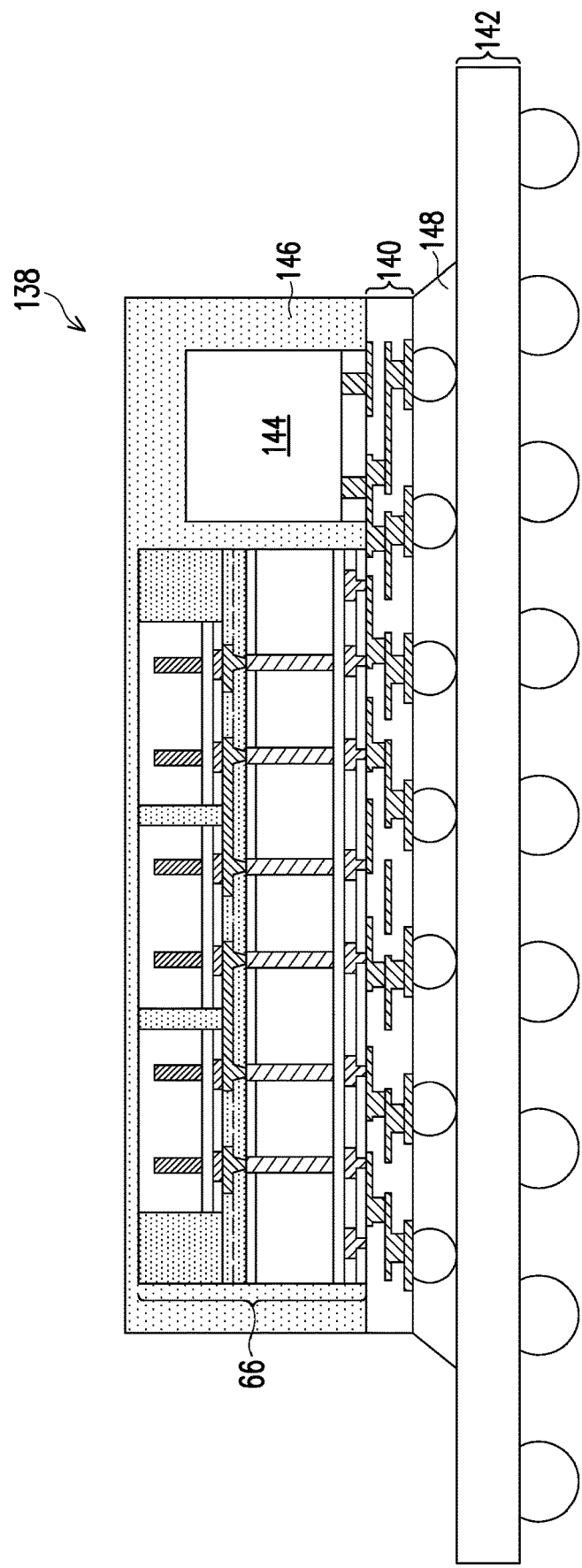

FIG. 20 illustrates a Chip-on-Wafer-on-Substrate (CoWoS) structure 138, in which package 66 acts as a chip, and is bonded to interposer 140. The bonding may be performed with interposer 140 being in an interposer wafer, hence the resulting structure is referred to as a Chip-on- Wafer (CoW) structure. The resulting CoW structure is then sawed in to packages, and one of the packages is bonded to package substrate 142. Interposer 140 may be free from active devices, and may be free from or include passive devices. Underfill 148 is dispensed between interposer 140 and package substrate 142. Furthermore, package component 144, which may be a device chip, a package, a memory cube, or the like, is bonded to package component 140. Encapsulant 146 encapsulates package 66 and package component 144 therein.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming bridge structures on the backside of lower-chips, the upper chips bonding to the lower chips may be electrically interconnected and signally communicating with each other through the bridge structures. The electrical connection and the signal communication do not need to go through the front side of the lower chip (through through-vias in the lower chips), so that power efficiency is improved, and latency is reduced. Furthermore, the bridge structures may be formed using damascene structures, and the line widths and pitches of the bridge structures may be small, so that the density and the total count of signal paths may be increased.

In accordance with some embodiments of the present disclosure, a method includes forming integrated circuits on a front side of a first chip; performing a backside grinding on the first chip to reveal a plurality of through-vias in the first chip; forming a first bridge structure on a backside of the first chip using a damascene process, wherein the first bridge structure comprises a first bond pad, a second bond pad, and a conductive trace electrically connecting the first bond pad to the second bond pad; and bonding a second chip and a third chip to the first chip through face-to-back bonding, wherein a third bond pad of the second chip is bonded to the first bond pad of the first chip, and a fourth bond pad of the third chip is bonded to the second bond pad of the first chip. In an embodiment, the forming the first bridge structure comprises a dual damascene process. In an embodiment, a dual damascene structure formed by the dual damascene process comprises a via and the conductive trace over and joined with the via, and wherein the via is in physical contact with a through-via in the plurality of through-vias. In an embodiment, the forming the first bridge structure comprises a single damascene process. In an embodiment, the method further comprises forming a first metal pad and a second metal pad on the backside of the first chip and in contact with a first through-via and a second through-via in the plurality of through-vias, wherein the first metal pad and the second metal pad are electrically connected to the first chip and the second chip, respectively. In an embodiment, the first chip, the second chip, and the third chip in combination comprises a power supplying path, and the power supplying path comprises: a through-via in the plurality of through-vias; a first interconnect structure in the first chip; the first bridge structure; and a second interconnect structure in the second chip. In an embodiment, the method further comprises forming a second bridge structure in the first chip, wherein the second bridge structure comprises a fifth bond pad and a sixth bond pad, and wherein the second chip is further bonded to the fifth bond pad; and bonding a fourth chip to the sixth bond pad of the first chip, wherein the power supplying path further comprises the second bridge structure. In an embodiment, entireties of the second chip and the third chip overlap the first chip, and the first chip extends laterally beyond all edges of the second chip and the third chip. In an embodiment, the method further comprises encapsulating the second chip and the third chip in an encapsulant; and sawing through the encapsulant and a wafer that comprises the first chip to separate the first chip, the second chip, and the third chip into a package. In an embodiment, the method further comprises packaging the package into an additional package. In an embodiment, the method further comprises forming an additional bridge structure on backsides of the second chip and the third chip; bonding a fourth chip over the second chip; and bonding a fifth chip over the third chip, wherein the fourth chip is electrically connected to the fifth chip through the additional bridge structure. In an embodiment, the additional bridge structure comprises a first via and a second via connected to through-vias in the second chip and the third chip, respectively.

In accordance with some embodiments of the present disclosure, a package includes a first chip comprising a semiconductor substrate; an integrated circuit at a front side of the semiconductor substrate; a plurality of through-vias penetrating through the semiconductor substrate; and a bridge structure on a backside of the semiconductor substrate, wherein the bridge structure comprises: a first bond pad; a second bond pad; and a conductive trace electrically coupling the first bond pad to the second bond pad; a second chip bonding to the first chip through face-to-back bonding, the second chip comprising a third bond pad bonding to the first bond pad; and a third chip bonding to the first chip through face-to-back bonding, the third chip comprising a fourth bond pad bonding to the second bond pad. In an embodiment, the bridge structure further comprises a first via in physical contact with a first through-via of the plurality of through-vias. In an embodiment, the bridge structure further comprises a second via in physical contact with a second through-via of the plurality of through-vias. In an embodiment, the first via, the first bond pad, the second bond pad, and the conductive trace are parts of a same dual damascene structure.

In accordance with some embodiments of the present disclosure, a package includes a first chip comprising a semiconductor substrate; a first interconnect structure on a front side of the semiconductor substrate, wherein the first interconnect structure comprises first damascene structures; a bridge structure on a backside of the semiconductor substrate, wherein the bridge structure comprises second damascene structures; and a through-via penetrating through the semiconductor substrate, wherein the through-via interconnects the first interconnect structure and the bridge structure; and a second chip and a third chip with front sides bonding to the first chip, wherein the second chip and the third chip are bonding to, and are in physically contact with, the bridge structure. In an embodiment, the package comprises a power supplying path, wherein the power supplying path comprises the through-via, a second interconnect structure of the second chip, the bridge structure, and a third interconnect structure of the third chip. In an embodiment, the first chip comprises a dual damascene structure on the backside of the semiconductor substrate, and wherein the dual damascene structure comprises a via, and the via is in physical contact with the through-via. In an embodiment, the package comprises a single damascene structure on the backside of the semiconductor substrate, wherein the single damascene structure is in physical contact with the through-via; and a dual damascene structure on the backside of the semiconductor substrate, wherein the dual damascene structure comprises a via, and the via is in physical contact with the single damascene structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming integrated circuits on a front side of a first chip, wherein the first chip comprises:
      a semiconductor substrate; and
      a first through-via and a second through-via extending from a front surface of the semiconductor substrate into the semiconductor substrate;
   performing a backside grinding on the first chip to reveal the first through-via and the second through-via;
   forming a bridge structure on a backside of the first chip using a damascene process, wherein the bridge structure comprises a conductive trace electrically interconnecting the first through-via and the second through-via; and
   bonding a second chip and a third chip to the first chip through face-to-back bonding, wherein the second chip is electrically connected to the bridge structure.

2. The method of claim 1 further comprising sawing a wafer to separate the first chip from other chips in the wafer, wherein the bridge structure is formed before the wafer is sawed.

3. The method of claim 1 further comprising encapsulating the first chip, the second chip, and the third chip in a first gap-filling material.

4. The method of claim 3, wherein the first chip further comprises a dielectric layer, wherein the bridge structure extends into the dielectric layer, and edges of the dielectric layer are in contact with the first gap-filling material.

5. The method of claim 3 further comprising encapsulating the second chip and the third chip in a second gap-filling material, wherein the first gap-filling material encapsulates the second gap-filling material therein.

6. The method of claim 1, wherein the bridge structure further interconnects the second chip and the third chip.

7. The method of claim 6, wherein the second chip comprises a first bond pad bonding to a first end of the bridge structure, and the third chip comprises a second bond pad bonding to a second end of the bridge structure.

8. The method of claim 1, wherein the forming the bridge structure comprises a dual damascene process.

9. The method of claim 1, wherein the bridge structure comprises a metal trace, and a first via and a second via underlying and connected to the metal trace, and wherein the first via and the second via are connected to the first through-via and the second through-via, respectively, in the first chip.

10. The method of claim 9, wherein the first via and the second via are in physical contact with the first through-via and the second through-via, respectively.

11. The method of claim 1, wherein the first chip, the second chip, and the third chip are in a first package component, and the method further comprises bonding a second package component to the first package component, and wherein at a time after the bonding, the second chip is over the first chip, and the second chip comprises:
   an additional semiconductor substrate; and
   a metal post extending into the additional semiconductor substrate, wherein the metal post comprises an end between a top surface and a bottom surface of the additional semiconductor substrate.

12. The method of claim 1, wherein the first chip, the second chip, and the third chip collectively comprise a power supplying path, and the power supplying path comprises:
   the first through-via;
   a first interconnect structure in the second chip;
   the bridge structure; and
   a second interconnect structure in the third chip.

13. A method comprising:
   forming a first chip comprising:
      forming an integrated circuit at a front side of a semiconductor substrate;
      forming a plurality of through-vias penetrating through the semiconductor substrate; and
      forming a first bridge structure on a backside of the semiconductor substrate, wherein the first bridge structure comprises:
         a first bond pad;
         a second bond pad; and
         a conductive trace electrically coupling the first bond pad to the second bond pad, wherein the first bridge structure is electrically connected to two through-vias in the plurality of through-vias;
   bonding a second chip to the first chip, wherein the second chip comprises a third bond pad bonding to the first bond pad; and
   bonding a third chip to the first chip, wherein the third chip comprising a fourth bond pad bonding to the second bond pad.

14. The method of claim 13 further comprising:
   forming a second bridge structure in the first chip, wherein the second bridge structure comprises a fifth bond pad and a sixth bond pad, and wherein the second chip is further bonded to the fifth bond pad; and
   bonding a fourth chip to the sixth bond pad of the first chip.

15. The method of claim 13, wherein entireties of the second chip and the third chip overlap the first chip, and the first chip extends laterally beyond all edges of the second chip and the third chip.

16. The method of claim 13 further comprising:
   encapsulating the second chip and the third chip in an encapsulant; and
   sawing through the encapsulant and a wafer that comprises the first chip to separate the first chip, the second chip, and the third chip into a package.

17. The method of claim 13, wherein the first bridge structure is formed through a damascene process.

18. A method comprising:
- forming a wafer comprising a first chip, the forming the wafer comprising:
  - forming a first interconnect structure on a front side of a semiconductor substrate, wherein the first interconnect structure comprises damascene structures;
  - thinning the semiconductor substrate so that a first through-via and a second through-via in the wafer penetrate through the semiconductor substrate; and
  - forming a bridge structure on a backside of the semiconductor substrate, wherein the bridge structure is formed through a dual damascene process;
- bonding front sides of a second chip and a third chip to the first chip, wherein each of the second chip and the third chip is electrically connected to both of the first through-via and the second through-via through the bridge structure; and
- sawing the wafer to separate the first chip in the wafer from additional chips in the wafer.

19. The method of claim 18, wherein the second chip and the third chip comprise a first bond pad and a second bond pad, respectively, wherein the first bond pad and the second bond pad are bonded to opposing ends of a metal trace in the bridge structure.

20. The method of claim 18, wherein the first through-via, a second interconnect structure of the second chip, the bridge structure, and a third interconnect structure of the third chip are electrically connected in series.

* * * * *